(12) United States Patent
Ouchi et al.

(10) Patent No.: US 8,040,717 B2
(45) Date of Patent: Oct. 18, 2011

(54) SRAM CELL AND SRAM DEVICE

(75) Inventors: Shinichi Ouchi, Tsukuba (JP); Yongxun Liu, Tsukuba (JP); Meishoku Masahara, Tsukuba (JP); Takashi Matsukawa, Tsukuba (JP); Kazuhiko Endo, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 182 days.

(21) Appl. No.: 12/521,408

(22) PCT Filed: Dec. 20, 2007

(86) PCT No.: PCT/JP2007/074547
§ 371 (c)(1),
(2), (4) Date: Jun. 26, 2009

(87) PCT Pub. No.: WO2008/081740
PCT Pub. Date: Jul. 10, 2008

(65) Prior Publication Data
US 2010/0315861 A1      Dec. 16, 2010

(30) Foreign Application Priority Data
Dec. 28, 2006   (JP) .................. 2006-354537

(51) Int. Cl.
*G11C 11/00*       (2006.01)
(52) U.S. Cl. ........... 365/156; 365/154; 365/63; 365/177
(58) Field of Classification Search .................. 365/156, 365/154, 63, 177, 174; 257/368, E27.06
See application file for complete search history.

(56) References Cited

U.S. PATENT DOCUMENTS
7,061,055 B2   6/2006   Sekigawa et al.
(Continued)

FOREIGN PATENT DOCUMENTS
JP           5 167073           7/1993
(Continued)

OTHER PUBLICATIONS

Davis, J. et al., "A 5.6GHz 64kB Dual-Read Data Cache for the POWER6 Processor", IEEE International Solid-State Circuits Conference, Session 34 / SRAM/34.1, pp. 2564-2571, (Feb. 6, 2006).

(Continued)

*Primary Examiner* — David Lam
(74) *Attorney, Agent, or Firm* — Oblon, Spivak, McClelland, Maier & Neustadt, L.L.P.

(57) ABSTRACT

A static random access memory (SRAM) cell includes a first to a fourth semiconductor thin plate that are provided on a substrate and are arranged parallel to each other. On respective semiconductor thin plates, there is formed a first four-terminal double-gate field effect transistor (FET) with a first conductivity type, a second and a third four-terminal double-gate FET which are connected in series with each other and have a second conductivity type, a fourth and a fifth four-terminal double-gate FET which are connected in series with each other and have the second conductivity type, and a sixth four-terminal double-gate FET with the first conductivity type. The third and the fourth four-terminal double-gate FETs form select transistors, and the first, second, fifth and sixth four-terminal double-gate FETs form a complementary metal-oxide-semiconductor (CMOS) inverter.

7 Claims, 8 Drawing Sheets

U.S. PATENT DOCUMENTS

| | | | |
|---|---|---|---|
| 7,417,889 B2 * | 8/2008 | Chuang et al. | 365/154 |
| 2002/0130354 A1 | 9/2002 | Sekigawa et al. | |
| 2005/0026377 A1 | 2/2005 | Kawasaki et al. | |
| 2005/0199964 A1 | 9/2005 | Sekigawa et al. | |
| 2007/0029623 A1 | 2/2007 | Liu et al. | |
| 2007/0090468 A1 | 4/2007 | Kawasaki et al. | |
| 2011/0024844 A1 * | 2/2011 | Ouchi | 257/368 |

FOREIGN PATENT DOCUMENTS

| | | |
|---|---|---|
| JP | 2002 270850 | 9/2002 |
| JP | 2005 64459 | 3/2005 |
| JP | 2005 167163 | 6/2005 |
| JP | 2005 174960 | 6/2005 |
| JP | 2005 260607 | 9/2005 |
| JP | 2007 201107 | 8/2007 |
| WO | 2005 079182 | 9/2005 |

OTHER PUBLICATIONS

O'Uchi, S. et al., "Flex-Pass-Gate SRAM Design for Static Noise Margin Enhancement Using FinFET-Based Technology", IEEE 2007 Custom Intergrated Circuits Conference (CICC), pp. 33-36, (Sep. 16, 2007).

* cited by examiner

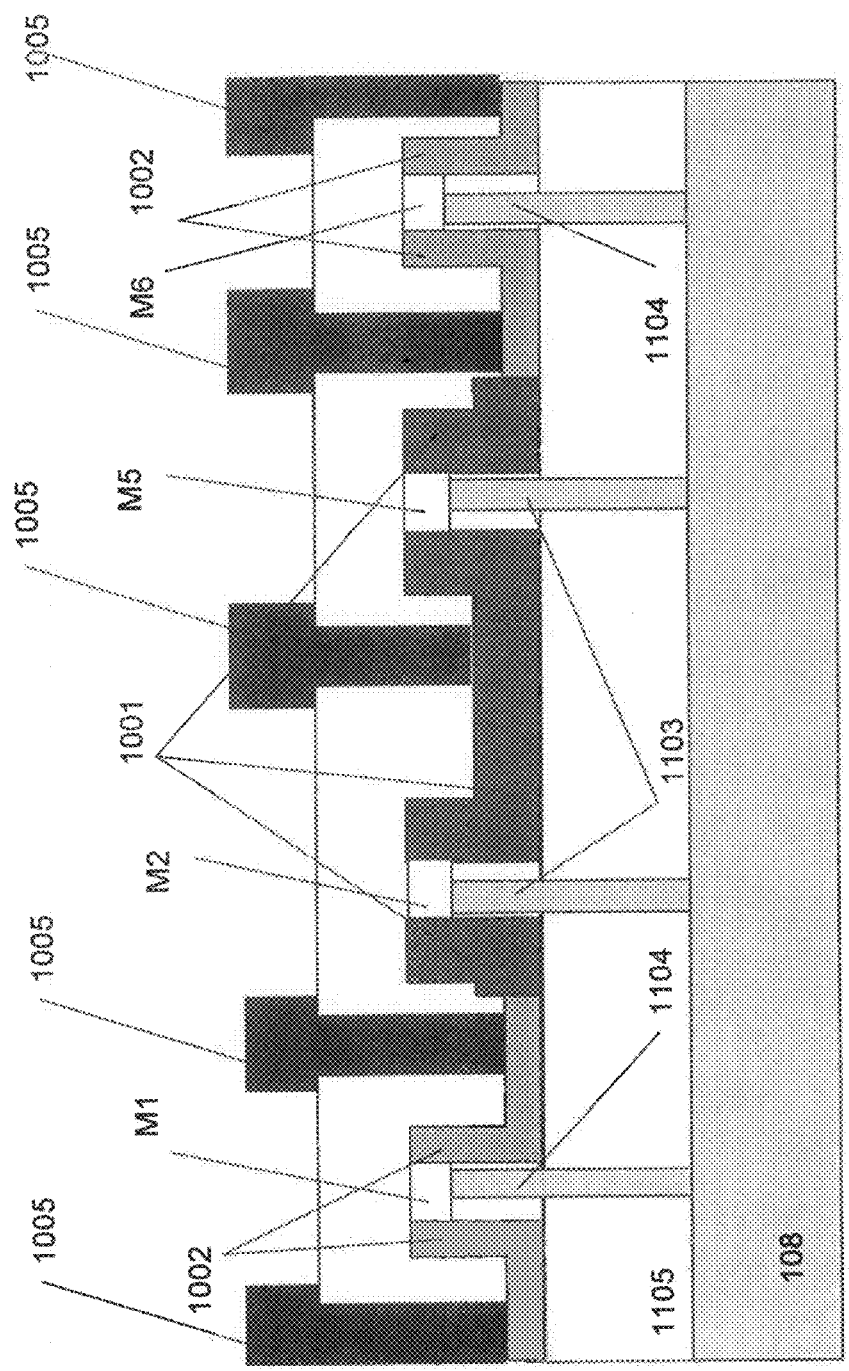

SRAM CELL AND SRAM DEVICE

TECHNICAL FIELD

The present invention relates to an SRAM (Static Random Access Memory) cell and an SRAM device.

BACKGROUND ART

Conventional SRAM cells consist of planar MOSFETs (Metal-Oxide-Semiconductor Field-Effect Transistors) on silicon substrates such as bulk wafer or SOI (Silicon On Insulator) wafer.

However, it will be difficult for a bulk planar MOSFET to suppress increase of a short channel effect. This means that a leak current will increase.

In order to avoid this problem, Patent Document 2 mentioned below discloses a SRAM device using four-terminal double-gate FETs (Field-Effect Transistors) that is disclosed in Patent Document 1 mentioned below.

FIG. 1 shows a schematic diagram of the four-terminal double-gate FET disclosed in Patent Document 1. The four-terminal double-gate FET comprises an SOI substrate having a layered structure of a semiconductor substrate 108 and an insulating film 107, a standing semiconductor thin plate 100 on the SOI substrate, a first gate that is on one side of the semiconductor thin plate 100 and consists of a first gate electrode 103 and a first gate insulating film 104, a second gate that is on the other side of the semiconductor thin plate 100 and consists of a second gate electrode 105 and a second gate insulating film 106, a source electrode 101 and a drain electrode 102, both of which are in contact with the standing semiconductor thin plate 100. Unlike FIG. 1, the source and drain electrodes can partly overlap with the first gate electrode 103 and the second electrode 105.

FIG. 2 shows symbols in a circuit diagram of the FET. The first gate electrode 103, the second gate electrode 105, the source electrode 101 and the drain electrode 102 correspond to 203, 204, 201 and 202, respectively, in an n-channel four-terminal double-gate FET 200, and correspond to 208, 209, 206 and 207, respectively, in a p-channel four-terminal double-gate FET 205.

When the four-terminal double-gate FET is used in a logic circuit, a logic signal which is an object of a signal processing is applied to the first gate, while the threshold voltage of the transistor which determines performance such as a processing speed is varied by a bias voltage applied to the second gate. The leakage current of the entire system can be reduced by changing the bias voltage applied to the second gate so as to select a high threshold voltage in a case when a low speed operation is permitted or to select a low threshold voltage in a case when a high speed operation is required.

A configuration example of an SRAM cell using the four-terminal double-gate FETs is disclosed in Patent Document 2. In this document, a flip-flop consists of the four-terminal double-gate FETs, where the first gate and the second gate of the p-channel FET is connected to each other, while the first gate and the second gate of the n-channel FET are used as a logic signal input gate and a threshold voltage control gate, respectively. Thereby, an off-state leakage current of the n-channel FET can be reduced by setting the threshold voltage of the n-channel FET in a standby state high.

Patent Document 3 and 4 mentioned below disclose two different device structures and fabrication methods thereof for further improving the performance of the four-terminal double-gate FET.

Patent Document 3 discloses a method for fabricating the insulating films of the first gate and the second gate such that they have different film thicknesses. By this method, it is feasible to enhance an effect of bias voltage applied to the second gate.

Patent Document 4 discloses a method for fabricating the insulating films of the first gate and the second gate such that they have different permittivities. The effect of bias voltage applied to the second gate can also be enhanced by this method.

Fabrication of such four-terminal double-gate FETs, the method of which are disclosed in each of the above patent document and therefore not described in detail here, is in general feasible by using a pattern as shown in FIG. 3. Here, 301 is a mask to form a fin, 302 is a mask to form gates, 303 and 304 are patterns to form contacts implemented in the mask of the same layer, that is 303 is a contact layer for the interconnection line for the fin, and 304 is a contact layer for the interconnection line for the gates. The gates which is crossing the standing semiconductor thin plate structure and depicted as a single FIGURE are deposited as shown in FIG. 3, and then may be separated so that the deposited gate structure formed on both sides of the standing semiconductor thin plate can act as the first gate and the second gate operating independently from each other.

However, the conventional SRAM has the following problems. In the SRAM circuit shown in Patent Document 2, leakage current can be reduced when the n-channel FET in the flip-flop is off. However, due to the property of the flip-flop circuit, when an n-channel FET in an inverter is off, an n-channel FET in the other inverter is on, so that the off current in this side cannot be reduced effectively. Therefore, a method for reducing the off current of a p-channel FET similarly to the n-channel FET is required.

In addition, although a circuit configuration to reduce a leakage current in the n-channel FETs is off is disclosed in Patent Document 2, a device structure, an arrangement method thereof and an interconnection method for integrating the FETs are not disclosed, and any appropriate method is not known. That is, although some effective layout methods are known for the conventional and standard device such as a planar MOSFET (Metal-Oxide-Semiconductor Field-Effect-Transistor) as described in, for example, Non-Patent Document 1, these methods can not be applied efficiently to the four-terminal double-gate FETs. Accordingly, it is required to realize a large scale integrated SRAM device by fabricating an SRAM cell using the four-terminal double-gate FETs in a small area.

The reason why the layout technique for the conventional MOSFETs can not be applied efficiently is that the four-terminal double-gate FET has two gates unlike the planar MOSFET, so that the number of contacts between the interconnection layers and the gates increases, which increases the area of the device. A new device layout which enables the interconnection lines to share gate contacts on the same node of the circuit topology as much as possible is required.

At the same time, as many contacts as possible connected to the same interconnection line are require to be aligned on a straight line in the new layout in order to reduce the complexity of the interconnection line and suppresses an increase in the area.

Patent Document 1: Japanese Unexamined Patent Application No. 2002-270850
Patent Document 2: Japanese Unexamined Patent Application No. 2005-260607
Patent Document 3: Japanese Unexamined Patent Application No. 2005-167163

Patent Document 4: Japanese Unexamined Patent Application No. 2005-174960

Non-Patent Document 1: J. Davis et al. "A 5.6 GHz 64 kB Dual-Read Data Cache for the POWER6 Processor", Visual Supplement 2006 to the Digest of Technical Papers of IEEE International Solid-State Circuits Conference, p. 514

DISCLOSURE OF INVENTION

The purpose of the present invention is to solve the problems described above, realize an SRAM cell using the four-terminal double-gate FETs in a small area, and provide a large scale integrated SRAM device with reduced leakage current and low power consumption.

The purpose described above can be fulfilled by the SRAM cells and devices described below.

(1) An SRAM cell including a first, a second, a third and a fourth semiconductor thin plates which stand on a single substrate and are arranged in parallel to each other in this order, on the first semiconductor thin plate being formed a first four-terminal double-gate FET with a first conductivity type; on the second semiconductor thin plate being formed a second and a third four-terminal double-gate FETs which are connected in series with each other and have a second conductivity type; on the third semiconductor thin plate being formed a fourth and a fifth four-terminal double-gate FETs which are connected in series with each other and have the second conductivity type; on the fourth semiconductor thin plate being formed a sixth four-terminal double-gate FET with the first conductivity type, wherein the third and the fourth four-terminal double-gate FETs form select transistors with their logic signal input gate being connected to the word line, and wherein the first and the second four-terminal double-gate FETs, and the fifth and the sixth four-terminal double-gate FETs form cross-coupled CMOS (complementary MOS) inverters to form a flip-flop, the SRAM cell being characterized in:

that the logic signal input gates of the first and the sixth four-terminal double-gate FETs are arranged on the sides facing the second and the third semiconductor thin plates, respectively, that the threshold voltage control gates of the second and the third four-terminal double-gate FETs and the threshold voltage control gates of the fourth and the fifth four-terminal double-gate FETs are arranged on the sides facing each other and each of the respective threshold voltage control gate is commonly connected to a first bias line, that the threshold voltage control gates of the first and the sixth four-terminal double-gate FETs are commonly connected to a second bias line, and that a word line, the first bias line and the second bias line are arranged orthogonally to the direction of arrangement of the first to the fourth semiconductor thin plates.

(2) An SRAM cell including a first, a second, a third and a fourth semiconductor thin plates which stand on a single substrate and are arranged in parallel to each other in this order, on the first semiconductor thin plate being formed a first four-terminal double-gate FET with a first conductivity type; on the second semiconductor thin plate being formed a second and a third four-terminal double-gate FETs which are connected in series with each other and have a second conductivity type; on the third semiconductor thin plate being formed a fourth and a fifth four-terminal double-gate FETs which are connected in series with each other and have the second conductivity type; on the fourth semiconductor thin plate being formed a sixth four-terminal double-gate FET with the first conductivity type, wherein the third and the fourth four-terminal double-gate FETs form select transistors with their logic signal input gate being connected to the word line, and wherein the first and the second four-terminal double-gate FETs, and the fifth and the sixth four-terminal double-gate FETs form cross-coupled CMOS inverters to form a flip-flop, the SRAM cell being characterized in:

that the logic signal input gates of the first and the sixth four-terminal double-gate FETs are arranged on the sides facing the second and the third semiconductor thin plates, respectively, that the threshold voltage control gates of the second and the third four-terminal double-gate FETs and the threshold voltage control gates of the fourth and the fifth four-terminal double-gate FETs are arranged on the sides facing each other, that the threshold voltage control gates of the second and the fifth four-terminal double-gate FETs are commonly connected to a first bias line, and the threshold voltage control gates of the third and the fourth four-terminal double-gate FETs are commonly connected to a third bias line, that the threshold voltage control gates of the first and the sixth four-terminal double-gate FETs are commonly connected to a second bias line, and that a word line, the first bias line, the second bias line and the third bias line are arranged orthogonally to the direction of arrangement of the first to the fourth semiconductor thin plates.

(3) The SRAM cell in accordance with claim 1 or 2, wherein the logic signal input gates of the first and the second four-terminal double-gate FETs are arranged in a position facing each other and the logic signal input gates of the fifth and the sixth four-terminal double-gate FETs are arranged in a position facing each other.

(4) The SRAM cell in accordance with any one of claims 1 to 3, wherein the third and the fourth four-terminal double-gate FETs are arranged adjacent to each other.

(5) The SRAM cell in accordance with any one of claims 1 to 4, wherein the first and the sixth four-terminal double-gate FETs are formed with channel widths different from the channel widths of the second to the fifth four-terminal double-gate FETs.

(6) An SRAM device, wherein a plurality of the SRAM cell in accordance with any one of claims 1 to 5 are arranged in a direction of arrangement of the first to the fourth semiconductor thin plates with line symmetry.

(7) The SRAM device in accordance with claim 6, wherein the second and the third semiconductor thin plates, both of which have the second conductivity type, are formed as a semiconductor thin plate commonly used for the arrangement of the plurality of SRAM cell.

Following effects can be obtained from the SRAM cell in accordance with the present invention.

1. Two side planes facing each other of the adjacent semiconductor thin plates, on respective one of the two side planes one of two FETs with the conductivity type different from each other being implemented, are used as a respective logic signal input gate of the FETs, so that the number of contacts from the interconnection line in layers above the first interconnection layer to the logic signal input gates can be reduced.

2. Two side planes facing each other of the adjacent semiconductor thin plates, on respective one of the two side planes one of two FETs with the same conductivity type being implemented, are used as a respective threshold voltage control gate of the FETs, so that the number of contacts from the interconnection line in layers above the first interconnection layer to the threshold voltage control gates can be reduced.

3. When a word line (WL) is arranged orthogonally to the direction of each of the semiconductor thin plates, the contacts from the WL to gates of the select transistors align on a straight line, thereby the area penalty for the layout is efficiently reduced.

4. Since the contacts to which a common threshold voltage control voltage is applied align on a straight line in parallel to the word line, the layout of contacts and the interconnection line for controlling the threshold voltage which is parallel to the word line is simplified, and controlling the threshold voltage by a unit of row in synchronization with a change of a signal on the word line becomes feasible.

5. Since all of the semiconductor thin plates align in parallel, a photolithographic process can be efficiently performed during the fabrication, and the variation in transistor performance is reduced.

In the SRAM device in accordance with the present invention, the SRAM cells in a cell array are arranged repeatedly in translational symmetry in the direction of the word line (WL) and in line symmetry about a boundary line with the adjacent cell in the direction of the bit lines (BL and BL~), so that the following effects can be obtained.

6. Contacts for supplying the source voltages $V_{DD}$ and $V_{SS}$ can be shared between cells.

7. Contacts of the bit lines (BL and BL~) can be shared between cells.

8. Gate contacts for supplying $V_{g2,p}$ to M1 and M6 can be shared between cells.

BRIEF DESCRIPTION OF THE DRAWINGS

FIG. 10 shows a schematic diagram of a cross section of the device shown in FIG. 8 (the device is fabricated by using a bulk silicon wafer).

BEST MODE FOR CARRYING OUT THE INVENTION

Figure 4:
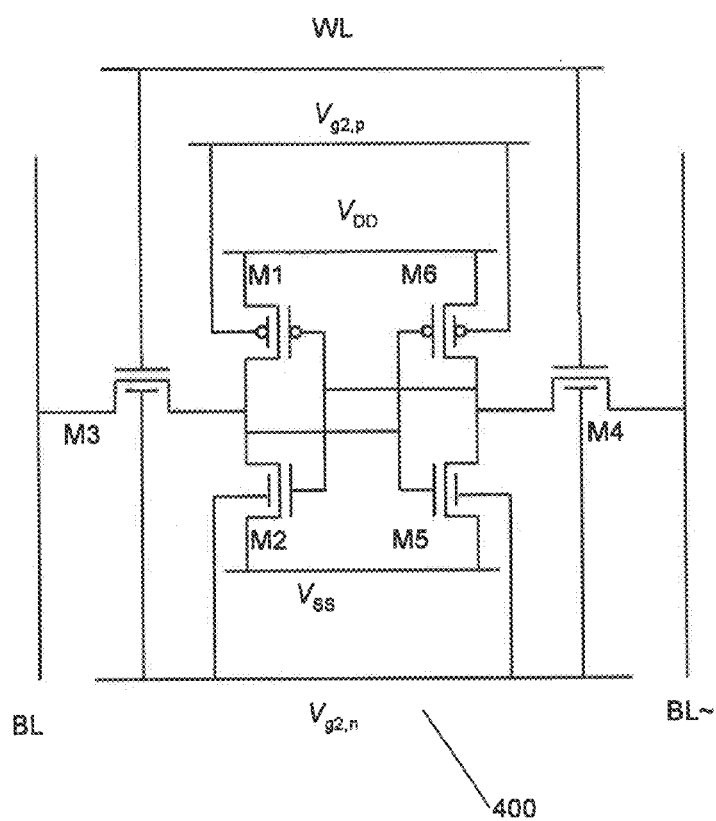
FIG. 4 shows a circuit diagram of an SRAM cell using four-terminal double-gate FETs.

Unlike the SRAM cell disclosed in Patent Document 2, a p-channel FET is also provided with a threshold voltage control gate in a circuit configuration shown in FIG. 4. In an SRAM cell 400, threshold voltages for n-channel FETs M2, M3, M4 and M5, and threshold voltages for p-channel FETs M1 and M6 are controlled by voltages applied to bias supplying interconnection lines $V_{g2,n}$ and $V_{g2,p}$, respectively. By this configuration, threshold voltages of both of the n-channel FETs and the p-channel FETs can be set high, thereby reducing leakage current of both the inverters in the flip-flop circuit.

As described above, the reason why the layout technique for the conventional MOSFETs can not be applied efficiently is that the four-terminal double-gate FET has two gates unlike the planar MOSFET, so that the number of contacts from the interconnection layers to the gates increases, which increases the area of the device. A new device layout which enables the interconnection lines to share gate contacts on the same node of the circuit topology as much as possible is required. At the same time, as many contacts as possible from the same interconnection line are require to be aligned on a strait line in the new layout in order to reduce the complexity of the interconnection line and suppresses an increase in the area.

The strategies to satisfy the requirements described above are:

1. To align two pairs of transistors (a pair of M1 and M2 and a pair of M5 and M6) forming a respective inverter as well as to align each inverter itself such that their gate contacts are laterally aligned.

2. To arrange access transistors (M3 and M4) such that their gate contacts are laterally aligned.

3. To use the gates facing with each other, each being for an FET with different conductivity type from that of the other FET, as the logic signal input gates.

4. To use the gate contacts facing with each other, each being for an FET with the same conductivity type as that of the other FET, as the threshold voltage control gates.

Figure 5:
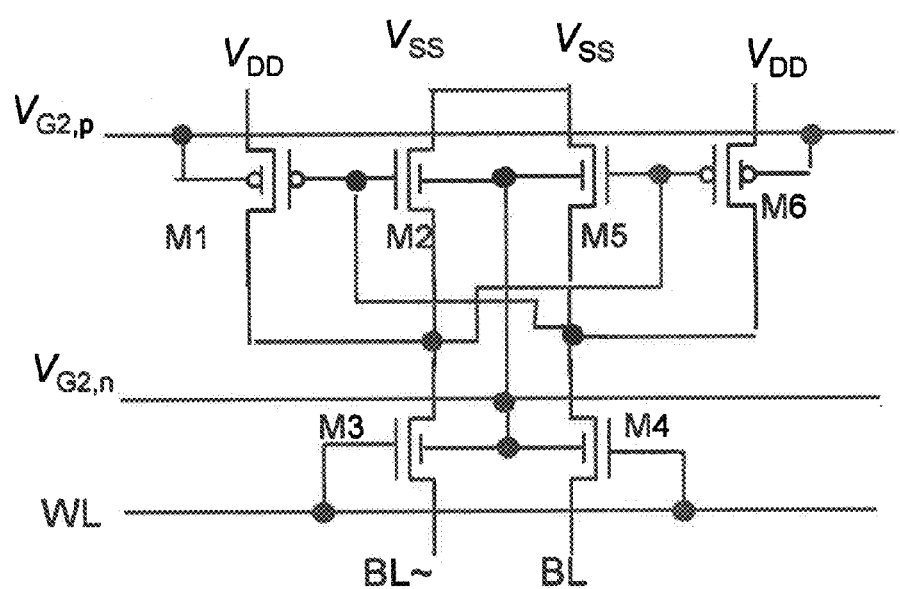
FIG. 5 shows a circuit diagram of an SRAM cell having the topology equivalent to an SRAM cell 400 shown in FIG. 4 and modified so as to fit an embodiment of the present invention.

These strategies can be represented by a circuit diagram as shown in FIG. 5, which is equivalent to that shown in FIG. 4.

Figure 6:
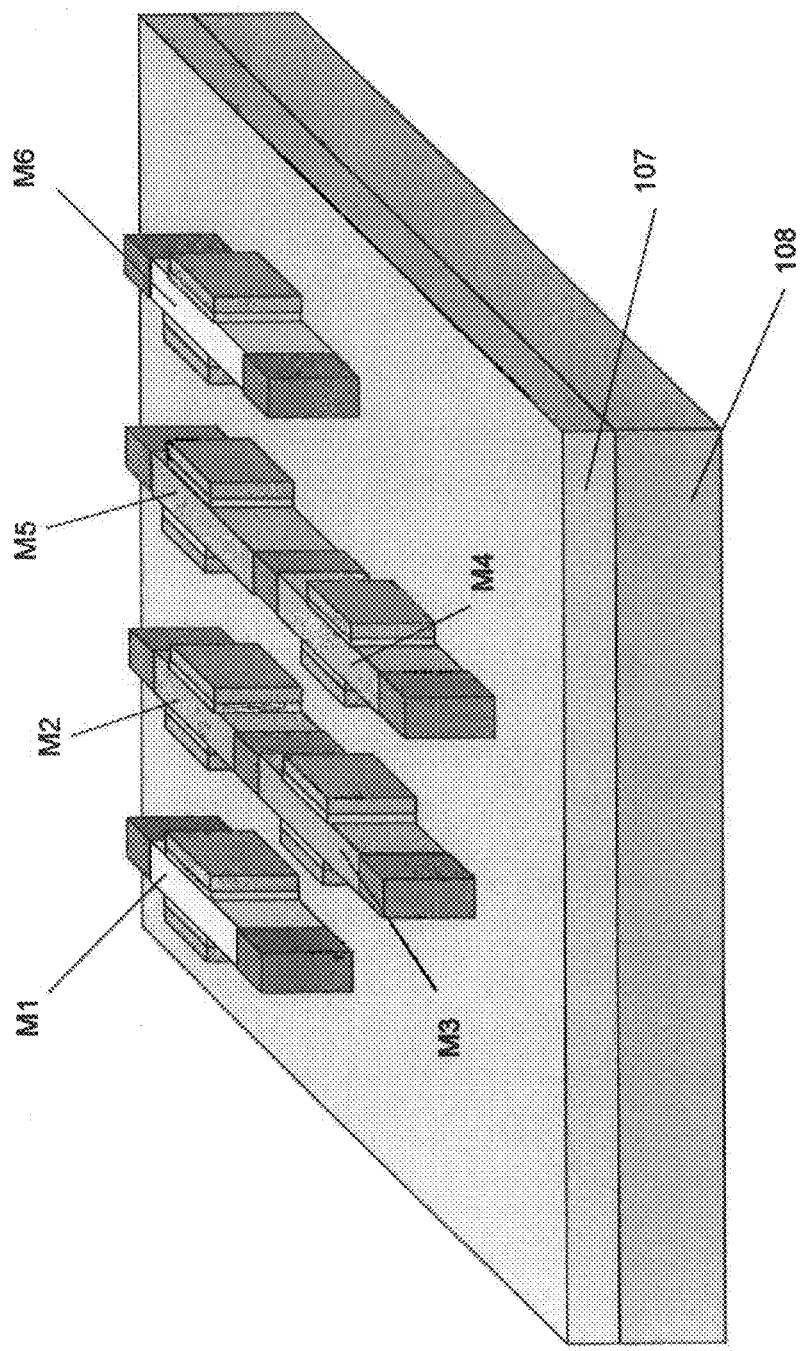
FIG. 6 is a schematic diagram of a device structure of an SRAM cell using four-terminal double-gate FETs with interconnection lines and others removed.

FIG. 6 is a three dimensional schematic diagram for realizing the circuit diagram shown in FIG. 5 as a real device structure. In FIG. 6, standing semiconductor thin plates on which FETs M1, M2, M5 and M6 forming a flip-flop are implemented are laterally aligned in a direction orthogonally to the word line. FET M3 that is series-connected to the FET M2 and FET M4 that is series-connected to the FET M5 are also laterally aligned. In this case, the FET M2 and the FET M3 can be implemented on and share a single standing semiconductor thin plate, as is also the case with the FET M5 and the FET M4.

The present invention will be described in more detail with reference to the embodiments. FIG. 5 shows a circuit diagram of the SRAM cell in accordance with the present invention. Like the circuit configuration of the cell 400, the threshold voltages of the n-channel four-terminal double-gate FETs M2, M3, M4 and M5 and the threshold voltages of the p-channel four-terminal double-gate FETs M1 and M6 are controlled by voltages supplied to the bias supplying interconnection lines $V_{g2,n}$ and $V_{g2,p}$, respectively.

FIG. 6 is a three dimensional schematic diagram illustrating a layout of the four-terminal double-gate FETs M1 to M6. The semiconductor thin plates on which the FETs M1, M2, M5 and M6 forming a flip-flop are implemented are laterally aligned in a direction orthogonally to the word line. The FET M3 that is series-connected to the FET M2 and the FET M4 that is series-connected to the FET M5 are also laterally aligned.

Figure 1:
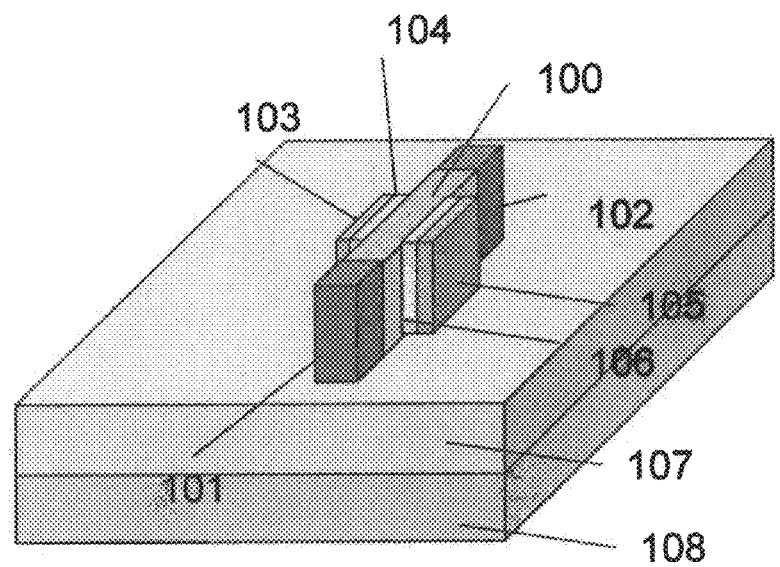
FIG. 1 shows a semiconductor thin plate.
Figure 2:
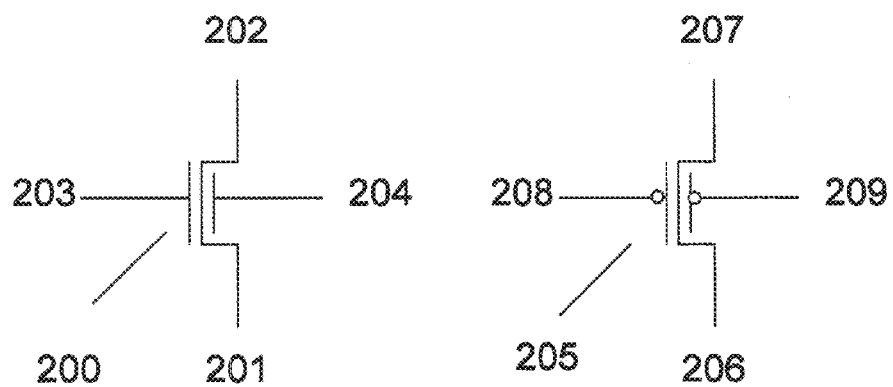
FIG. 2 shows symbols in a circuit diagram of an n-channel four-terminal double-gate FET and a p-channel four-terminal double-gate FET.
Figure 3:
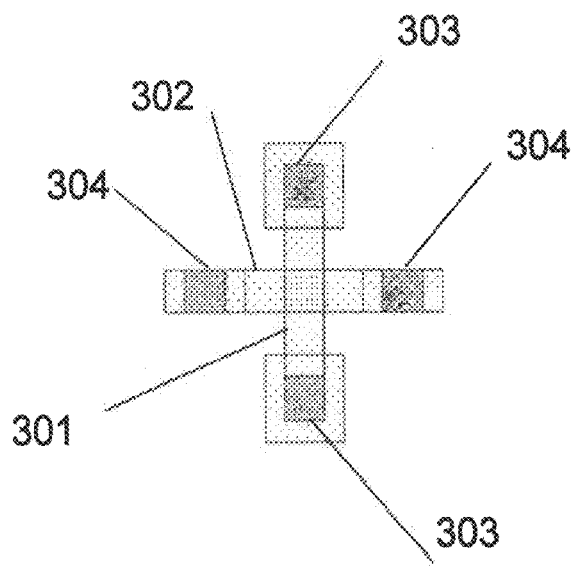
FIG. 3 shows a schematic diagram of a mask structure used for fabrication of a four-terminal double-gate FET.
Figure 7:
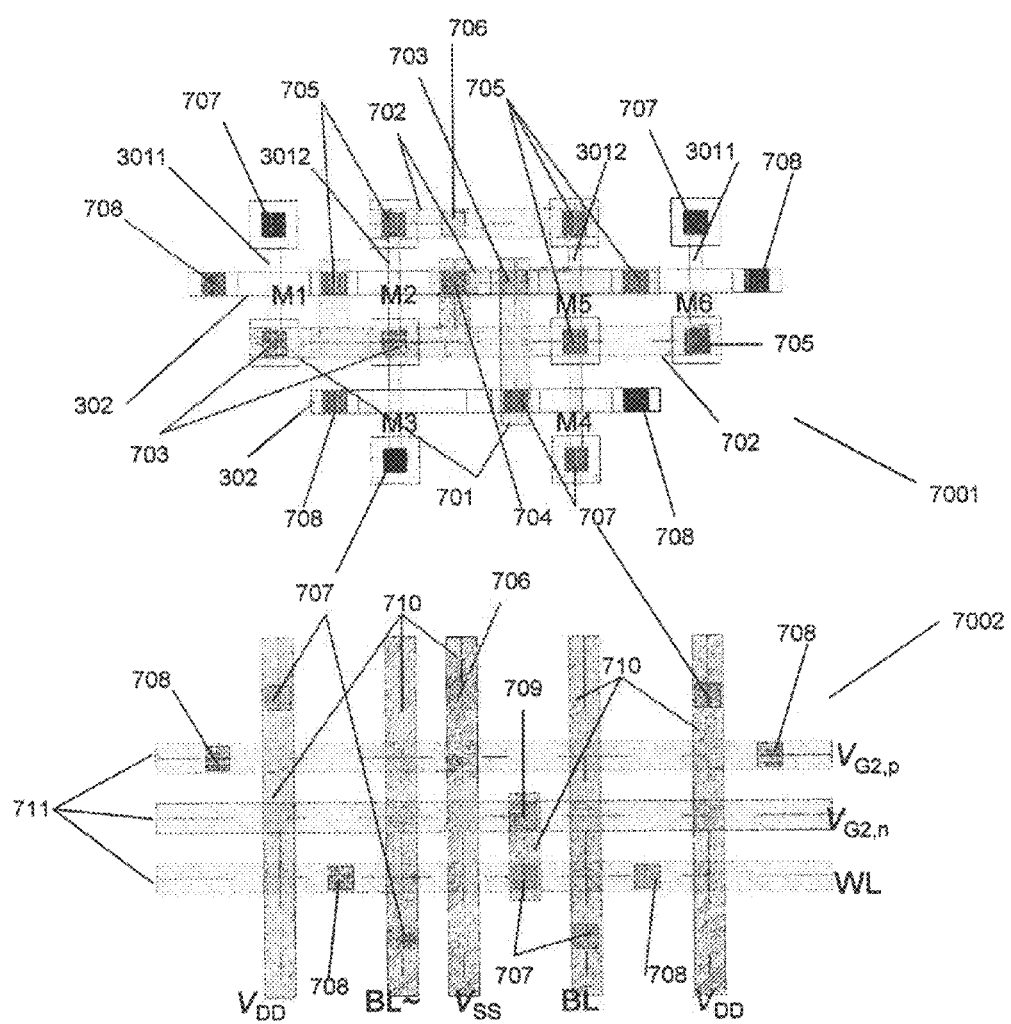
FIG. 7 shows a mask layout for an SRAM cell.

FIG. 7 shows a layout for a single cell. 7001 shows a semiconductor layer, a gate layer, an interconnection line in the first layer, and an interconnection line in the second layer for the FET, and 7002 shows an interconnection line in the third layer and an interconnection line in the fourth layer. 3011 shows a structure including the semiconductor thin plate on which the p-channel FET is implemented as well as its source and drain contacts, and 3012 shows a structure including the semiconductor thin plate on which the n-channel FET is implemented as well as its source and drain contacts. In FIG. 7, in addition to the semiconductor thin plate shown in FIG. 6, a structure is included where the thin plate becomes thicker in order to provide the source and drain contacts. 302 corresponds to the gate structure as shown in FIG. 3, 701 is a metal interconnection line in the first layer, 702 is a metal interconnection line in the second layer, 703 is a contact connecting the interconnection line in the first layer with a semiconductor thin plate structure or a gate layer, 704 is a first via hole connecting between the interconnection line in the first layer and the interconnection line in the second layer, 705 is a combined structure of 703 and 704, 706 is a second via hole connecting between the interconnection line 710 in the third layer and the interconnection line in the second layer, 707 is a combined structure of 703, 704 and 706, 709 is a third via hole connecting between the interconnection line 711 in the fourth layer and the interconnection line in the third layer, and 708 is a combined structure of 703, 704, 706, and 709. In a region where 302 overlaps with 3011 and 3012, the four-terminal double-gate FETs M1 to M6 forming an SRAM cell are formed.

Here, in accordance with the following layout rules 1 to 4 which are considered to be valid in future at least after the half-pitch-32 nm technology node, an area occupied by a single cell is calculated to be $144F^2$ where F is a half pitch of the interconnection lines.

1. Contacts in the closest proximity are arranged in a staggered configuration.
2. The pitch of the metal interconnection line in the first layer is given by the pitch of the staggered contacts.
3. A pitch of the interconnection lines in the intermediate layers from the second layer to the fifth layer can adopt the same rule as that of the metal interconnection line in the first layer.
4. Via holes which short circuit the interconnection lines in and below the intermediate layers are permitted to be arranged with a pitch similar to the pitch of the contacts.

On the other hand, in accordance with a layout of the point symmetrical arrangement of transistors as described, for example in Non-Patent Document 1 which has become a predominant layout in recent years in the conventional CMOS technologies, and in accordance with the layout rule 1 to 4, the area corresponding to a single cell is calculated to be $160F^2$, which indicate less efficient as compared with the present invention.

Figure 8:
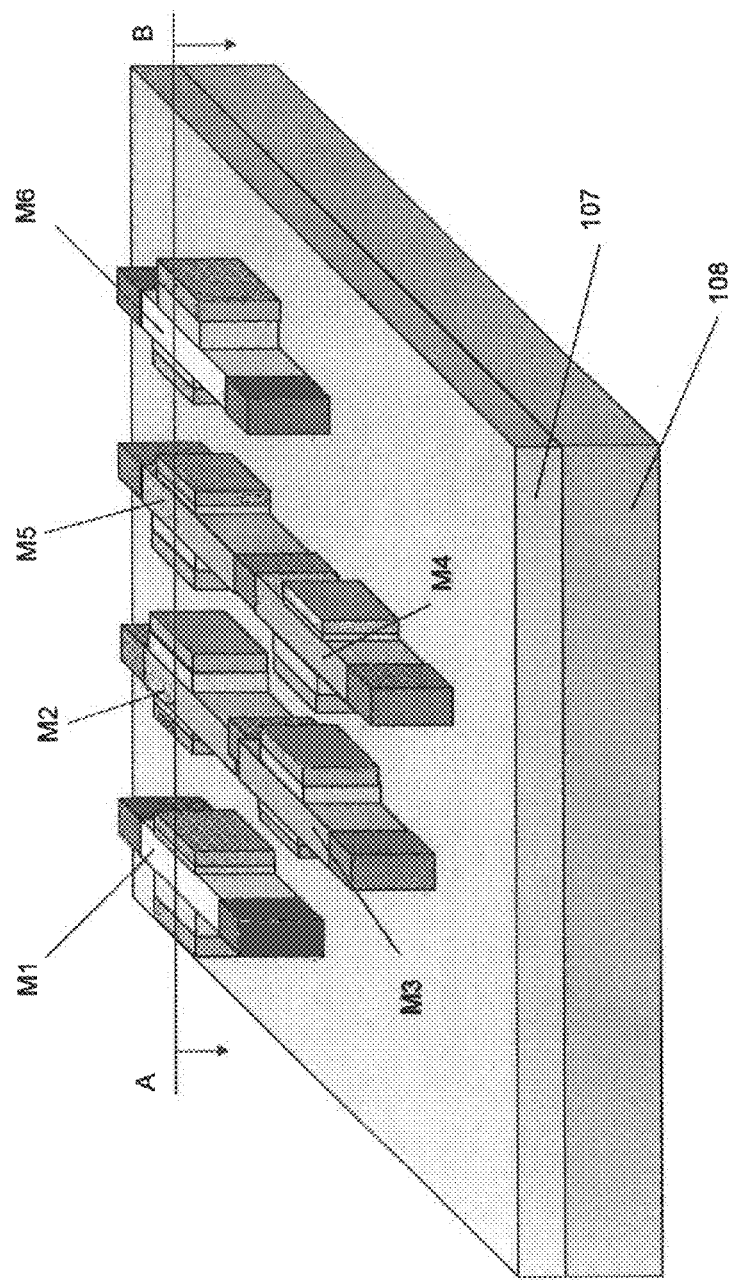
FIG. 8 shows a schematic diagram of another SRAM cell.

The SRAM using the four-terminal double-gate FETs as disclosed by the embodiments facilitates efficiently to reduce an off-state leakage current by reducing the sub-threshold coefficient by means of increasing the thickness of the gate insulating film of the threshold voltage control gate. FIG. 8 schematically shows the three dimensional structure of the cell. As shown in FIG. 8, the gate insulation films of the facing threshold voltage control gates implemented on the semiconductor thin plates are made thick. This structure can be realized by using the semiconductor thin plate fabricated on an SOI substrate as shown in FIG. 9 and by the semiconductor thin plate fabricated on a processed bulk silicon substrate as shown in FIG. 10.

Figure 9:
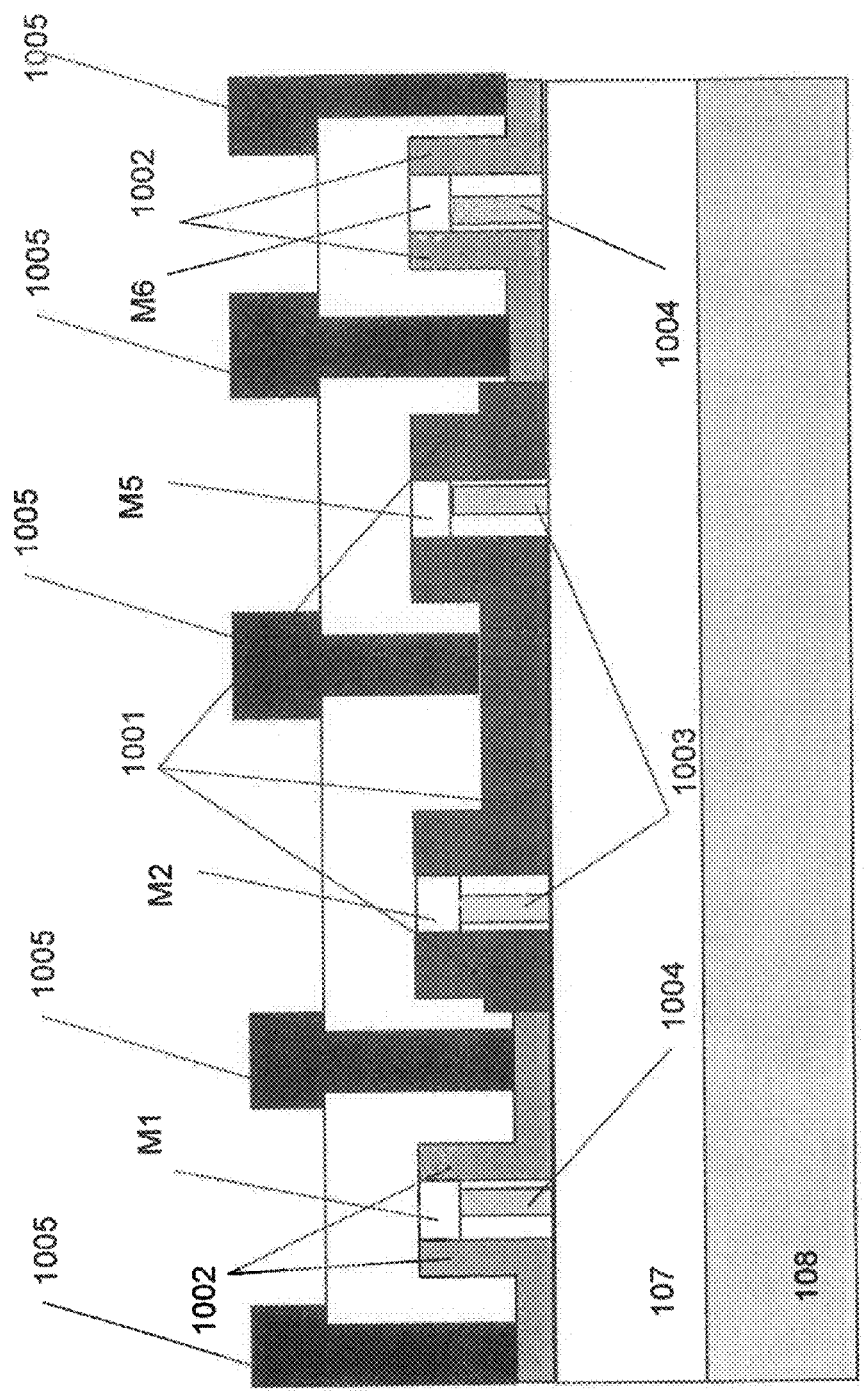
FIG. 9 shows a schematic diagram of a cross section of the device shown in FIG. 8 (the device is fabricated by using an SOI wafer).

FIG. 9 shows a cross section AB in a case when the structure shown in FIG. 8 is realized by using an SOI substrate, while FIG. 10 shows a cross section AB in a case when the structure shown in FIG. 8 is realized by using a bulk silicon substrate. 1001 is a gate material for an n-channel FET, 1003 is a semiconductor thin plate for an n-channel FET, 1002 is a gate material for a p-channel FET, 1004 is a semiconductor thin plate for a p-channel FET, and 1005 shows a contact and an interconnection line. In FIG. 10, 1103 is a semiconductor thin plate for an n-channel FET, 1104 is a semiconductor thin plate for a p-channel FET, both of which are formed from a bulk silicon substrate.

The SRAM device in accordance with the present invention can be realized by configuring SRAM cells repeatedly in translational symmetry in the direction of the word line, and in line symmetry about the border line with the adjacent cell in the direction of the bit line. Furthermore, a semiconductor thin plate for the n-channel FET can be used as a semiconductor thin plate common to a plurality of SRAM cells arranged in the SRAM device.

The embodiments described above are only for easily understanding the present invention, and not for limiting the present invention to the embodiments. That is, any modifications and other variations based on the spirit of the present invention are of course included in the scope of the present invention.

For example, although the threshold voltage control gates of the second to the fifth four-terminal double-gate FETs (M2 to M5) are demonstrated to be in common connection to the first bias line in the embodiment, the commonly connected threshold voltage control gates of the second and the fifth four-terminal double-gate FETs (M2 and M5) may be connected to a bias line which is different from a bias line to which the commonly connected threshold voltage control gates of the third and the fourth four-terminal double-gate FETs (M3 and M4) are connected. Although an arrangement space for an additional third bias line is needed in this case, furthermore reduced power consumption can be realized since the threshold voltage of the select transistors (M3 and M4) can be controlled separately.

In addition, the first and the sixth p-channel four-terminal double-gate FETs may be formed to have a channel width different from the channel width of the second to the fifth n-channel four-terminal double-gate FETs by making the height of the semiconductor thin plates to which the p-channel FETs are implemented different from the height of the semiconductor thin plates to which the n channel FETs are implemented, for example. Thus, a balance of the strength for the pull-up and pull-down of the flip-flop can be adjusted, thereby optimizing the performance.

The invention claimed is:

1. A static random access memory (SRAM) cell including a first, a second, a third and a fourth semiconductor thin plate that are provided on a single substrate and are arranged in parallel to each other in order, on the first semiconductor thin plate being formed a first four-terminal double-gate field effect transistor (FET) with a first conductivity type, on the second semiconductor thin plate being formed a second and a third four-terminal double-gate FET which are connected in series with each other and have a second conductivity type, on the third semiconductor thin plate being formed a fourth and a fifth four-terminal double-gate FET which are connected in series with each other and have the second conductivity type, on the fourth semiconductor thin plate being formed a sixth four-terminal double-gate FET with the first conductivity type, wherein the third and the fourth four-terminal double-gate FETs form select transistors with their logic signal input gates of the third and the fourth four-terminal double-gate FETs being connected to the word line, wherein the first and the second four-terminal double-gate FETs, and the fifth and the sixth four-terminal double-gate FETs form cross-coupled complementary metal-oxide-semiconductor (CMOS) inverters to form a flip-flop, and wherein logic signal input gates of the first and the sixth four-terminal double-gate FETs are arranged on sides facing the second and the third semiconductor thin plates, respectively, threshold voltage control gates of the second and the third four-terminal double-gate FETs and the threshold voltage control gates of the fourth and the fifth four-terminal double-gate FETs are arranged on sides facing each other and each of the respective threshold voltage control gates of the second to the fifth four-terminal double-gate FETs is commonly connected to a first bias line, threshold voltage control gates of the first and the sixth four-terminal double-gate FETs are commonly connected to a second bias line, and a word line, the first bias line and the second bias line are arranged orthogonally to a direction of arrangement of the first to the fourth semiconductor thin plates.

2. A static random access memory (SRAM) cell including a first, a second, a third and a fourth semiconductor thin plate that are provided on a single substrate and are arranged in parallel to each other in order, on the first semiconductor thin plate being formed a first four-terminal double-gate field effect transistor (FET) with a first conductivity type, on the second semiconductor thin plate being formed a second and a third four-terminal double-gate FET which are connected in series with each other and have a second conductivity type, on the third semiconductor thin plate being formed a fourth and a fifth four-terminal double-gate FET which are connected in series with each other and have the second conductivity type, on the fourth semiconductor thin plate being formed a sixth four-terminal double-gate FET with the first conductivity type, wherein the third and the fourth four-terminal double-gate FETs form select transistors with logic signal input gates of the third and the fourth four-terminal double-gate FETs being connected to the word line, wherein the first and the second four-terminal double-gate FETs, and the fifth and the sixth four-terminal double-gate FETs form cross-coupled inverters to form a flip-flop, and wherein logic signal input gates of the first and the sixth four-terminal double-gate FETs are arranged on sides facing the second and the third semiconductor thin plates, respectively, threshold voltage control gates of the second and the fifth four-terminal double-gate FETs are commonly connected to a first bias line, and threshold voltage control gates of the third and the fourth four-terminal double-gate FETs are commonly connected to a third bias line, threshold voltage control gates of the first and the sixth four-terminal double-gate FETs are commonly connected to a second bias line, and a word line, the first bias line, the second bias line and the third bias line are arranged orthogonally to a direction of arrangement of the first to the fourth semiconductor thin plates.

3. The SRAM cell in accordance with claim 1 or 2, wherein logic signal input gates of the first and the second four-terminal double-gate FETs are arranged in a position facing each other and logic signal input gates of the fifth and the sixth four-terminal double-gate FETs are arranged in a position facing each other.

4. The SRAM cell in accordance with any one of claims 1 and 2, wherein the third and the fourth four-terminal double-gate FETs are arranged adjacent to each other.

5. The SRAM cell in accordance with any one of claims 1 and 2, wherein the first and the sixth four-terminal double-gate FETs are formed with channel widths different from channel widths of the second to the fifth four-terminal double-gate FETs.

6. An SRAM device, wherein a plurality of SRAM cells, each in accordance with the SRAM cell of any one of claims 1 and 2, are arranged in a direction of arrangement of the first to the fourth semiconductor thin plates with line symmetry.

7. The SRAM device in accordance with claim 6, wherein the second and the third semiconductor thin plates, each having the second conductivity type, are formed as a semiconductor thin plate commonly used for the arrangement of the plurality of SRAM cells.

* * * * *